United States Patent
Zheng et al.

(10) Patent No.: US 10,825,984 B1
(45) Date of Patent: Nov. 3, 2020

(54) SENSORS INCLUDING DUMMY ELEMENTS ARRANGED ABOUT A SENSING ELEMENT

(71) Applicant: GLOBALFOUNDRIES Singapore Pte. Ltd., Singapore (SG)

(72) Inventors: Ping Zheng, Singapore (SG); Eng Huat Toh, Singapore (SG); Samarth Agarwal, Bangalore (IN); Lanxiang Wang, Singapore (SG); Shyue Seng Tan, Singapore (SG); Ruchil Kumar Jain, Singapore (SG)

(73) Assignee: GLOBALFOUNDRIES SINGAPORE PTE. LTD., Singapore (SG)

(*) Notice: Subject to any disclaimer, the term of this patent is extended or adjusted under 35 U.S.C. 154(b) by 0 days.

(21) Appl. No.: 16/546,844

(22) Filed: Aug. 21, 2019

(51) Int. Cl.
| | |
|---|---|
| *H01L 41/12* | (2006.01) |
| *G01R 33/09* | (2006.01) |
| *H01L 27/22* | (2006.01) |
| *H01L 41/20* | (2006.01) |
| *H01L 41/06* | (2006.01) |
| *H01L 27/20* | (2006.01) |
| *H01L 41/47* | (2013.01) |
| *G01R 15/20* | (2006.01) |

(52) U.S. Cl.
CPC .............. *H01L 41/12* (2013.01); *G01R 15/20* (2013.01); *G01R 15/205* (2013.01); *G01R 33/093* (2013.01); *H01L 27/20* (2013.01); *H01L 27/22* (2013.01); *H01L 41/06* (2013.01); *H01L 41/125* (2013.01); *H01L 41/20* (2013.01); *H01L 41/47* (2013.01)

(58) Field of Classification Search
CPC .... G01R 33/093; G01R 15/20; G01R 15/205; H01L 27/20; H01L 27/22; H01L 41/06; H01L 41/12; H01L 41/125; H01L 41/20; H01L 41/47
See application file for complete search history.

(56) References Cited

U.S. PATENT DOCUMENTS

| | | | |
|---|---|---|---|
| 7,405,560 | B2 | 7/2008 | Shimizu et al. |
| 7,592,803 | B1 | 9/2009 | Guo et al. |
| 9,030,200 | B2 | 5/2015 | Deak |
| 9,435,662 | B2 | 9/2016 | Ausserlechner |
| 2002/0036919 | A1* | 3/2002 | Daughton ............. H01L 27/228 365/173 |
| 2003/0094944 | A1* | 5/2003 | Suzuki ................. G01R 33/093 324/252 |
| 2005/0122828 | A1* | 6/2005 | Odagawa ............... G11C 11/16 365/232 |

OTHER PUBLICATIONS

Shakya et al., "Giant Magnetoresistance and Coercivity of electrodeposited multilayered FeCoNi/Cu and CrFeCoNi/Cu", Journal of Magnetism and Magnetic Materials, vol. 324, Issue 4, p. 453-459.
Jeng et al, "Quasi-Static Current Measurement with Field-Modulated Spin-Valve GMR Sensors", Sensors 2019, 19(8), 1882.

* cited by examiner

*Primary Examiner* — Feifei Yeung Lopez
(74) *Attorney, Agent, or Firm* — Thompson Hine LLP

(57) ABSTRACT

Structures for a sensor and methods of forming such structures. A sensing element includes a free magnetic layer, a pinned magnetic layer, and a non-magnetic conductive spacer layer between the free magnetic layer and the pinned magnetic layer. A dummy element is positioned outside of an outer boundary of the sensing element. The dummy element is detached from the sensing element.

20 Claims, 4 Drawing Sheets

SENSORS INCLUDING DUMMY ELEMENTS ARRANGED ABOUT A SENSING ELEMENT

BACKGROUND

The present invention relates to integrated circuits and semiconductor device fabrication and, more specifically, to structures for a sensor and methods of forming such structures.

Magnetoresistive sensors and Hall sensors are common types of sensors found in various commercial products. A magnetoresistive sensor detects a magnetic field through the change in resistance of its sensing layer as a function of the strength and direction of an external magnetic field being sensed by the sensing layer. One type of magnetoresistive sensor is the giant magnetoresistance (GMR) spin valve.

In a GMR spin valve, the resistance of the sensing element varies as a function of the spin-dependent transmission of electrons between free and pinned magnetic layers separated by a nonmagnetic conductive spacer and the accompanying spin-dependent scattering that occurs at the interfaces of the magnetic and nonmagnetic layers and within the magnetic layers. The pinned layer has a fixed magnetization. In contrast, the magnetization of the free layer is not fixed and is instead free to rotate in response to the external magnetic field. In a GMR spin valve, the spin valve effect varies as the cosine of the angle between the magnetization of the pinned layer and the magnetization of the free layer. The external magnetic field causes a change in the direction of the magnetization in the free layer, which in turn causes a change in resistance of the GMR spin valve and a corresponding change in the sensed current or voltage. The GMR spin valve has a resistance when the magnetizations are parallel, and a higher resistance with the magnetizations are antiparallel. The higher resistance is derived from an elevation in the electron scattering in the antiparallel state.

Various parameters of a GMR spin valve may be used to evaluate its performance. For example, one such performance parameter is the magnetoresistive (MR) ratio, also referred to as the MR coefficient. The MR ratio is defined as a net change in resistance between the different states and may be expressed by $(R_{AP}-R_P)/R_P$, where $R_{AP}$ is the resistance of the GMR spin valve in the antiparallel state and $R_P$ is the resistance of the GMR spin valve in the parallel state. The MR ratio is an expression of the magnitude of the sensor response, and thus the operation of a GMR spin valve may be optimized by maximizing the MR ratio.

The free and pinned magnetic layers of a GMR spin valve may be composed of ferromagnetic materials. The performance of a GMR spin valve may be degraded by hysteresis arising from crystalline anisotropy and grain shape anisotropy of the constituent ferromagnetic materials. Even after the external field is removed, part of the parallel or antiparallel alignment is retained. The linearity and accuracy of a GMR spin valve is restricted by the impact of hysteresis on the MR ratio.

Improved structures for a sensor and methods of forming such structures are needed.

SUMMARY

According to an embodiment of the invention, a structure includes a sensing element having a free magnetic layer, a pinned magnetic layer, and a non-magnetic conductive spacer layer between the free magnetic layer and the pinned magnetic layer. A dummy element is positioned outside of an outer boundary of the sensing element. The dummy element is detached from the sensing element.

According to another embodiment of the invention, a method includes forming a sensing element including a free magnetic layer, a pinned magnetic layer, and a non-magnetic conductive spacer layer between the free magnetic layer and the pinned magnetic layer, and forming a dummy element positioned outside of an outer boundary of the sensing element. The dummy element is detached from the sensing element.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
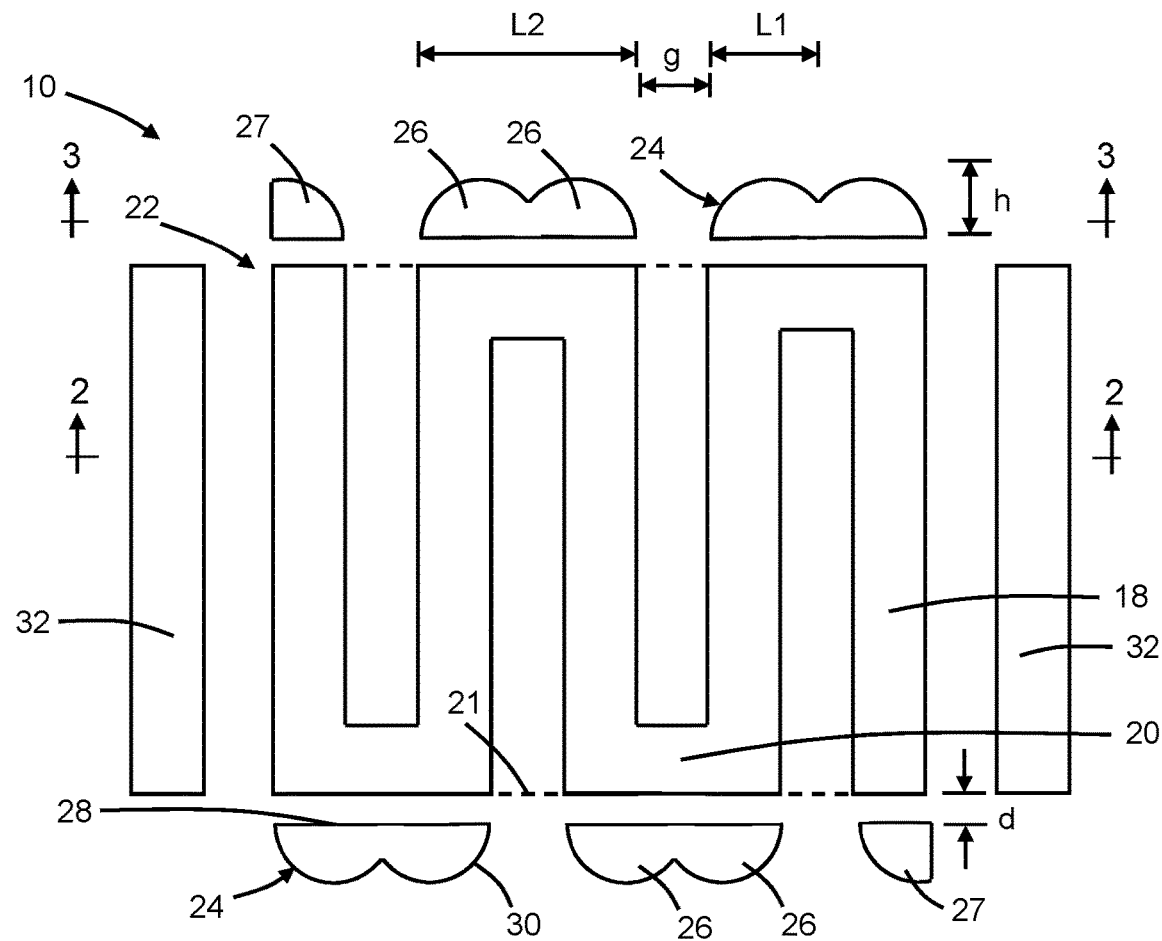
FIG. 1 is a top view of a structure for a sensor in accordance with embodiments of the invention.
Figure 2:
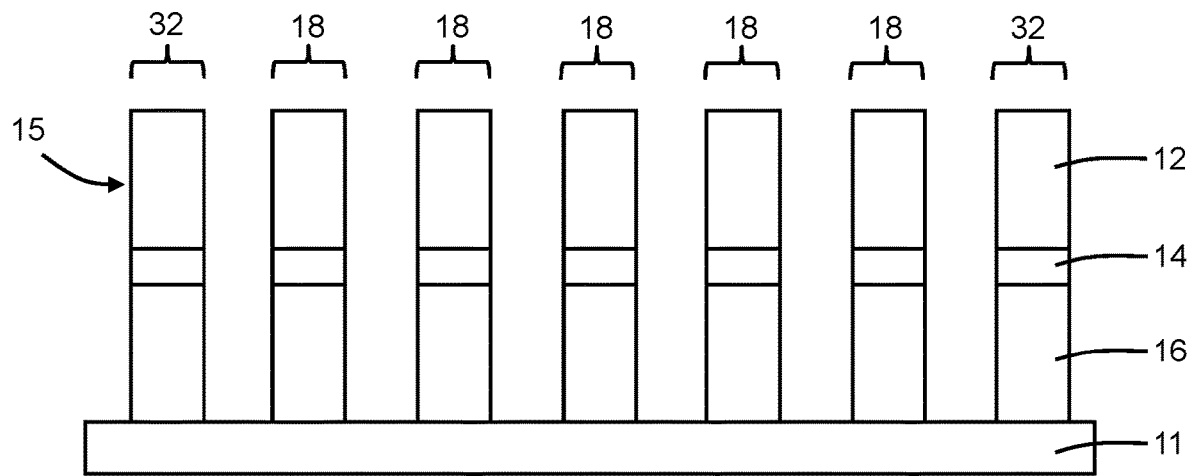
FIG. 2 is a cross-sectional view taken generally along line 2-2 in FIG. 1.
Figure 3:
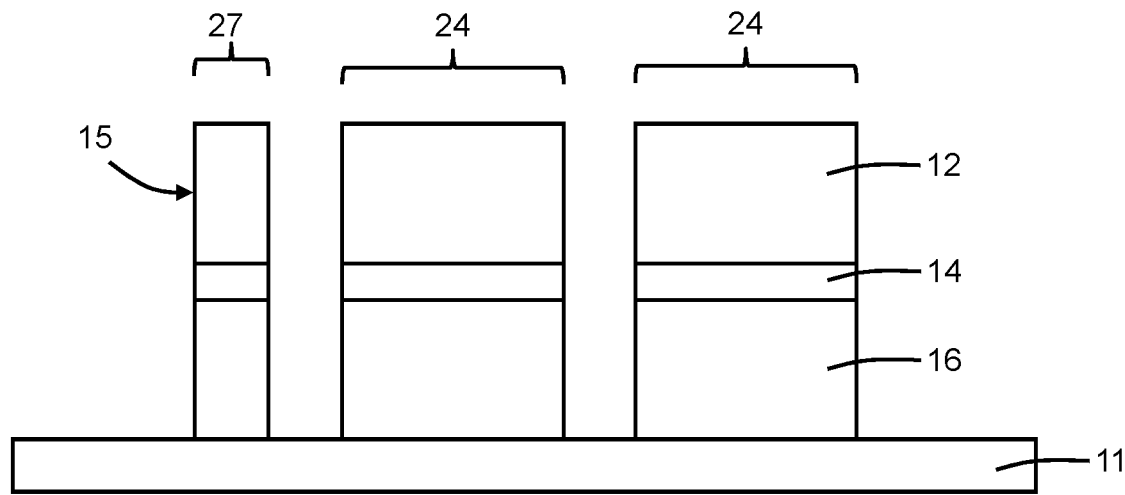
FIG. 3 is a cross-sectional view taken generally along line 3-3 in FIG. 1.

With reference to FIGS. 1, 2, 3 and in accordance with embodiments of the invention, a structure 10 for a sensor includes a free layer 12, a conductive spacer layer 14, and a pinned layer 16 that are arranged in a layer stack on a substrate 11. The free layer 12, pinned layer 16, and conductive spacer layer 14 are arranged in the layer stack 15 with the conductive spacer layer 14 positioned between the free layer 12 and the pinned layer 16. The free layer 12 and pinned layer 16 may be composed of a magnetic conductor, such as a cobalt-iron alloy (e.g., cobalt-iron or cobalt-iron-boron), platinum manganese, iridium manganese, nickel manganese, or iron manganese. The conductive spacer layer 14 may be composed of a non-magnetic conductor, such as copper or silver.

A portion of the layer stack 15 defines a magnetoresistive sensing element 22 having the functional form of a giant magnetoresistance (GMR) spin valve. During operation, the pinned layer 16 polarizes the electron spin of a programming current directed to the structure 10, and torque is created as the spin-polarized current passes through the layer stack 15. The spin-polarized current interacts with the free layer 12 by exerting a torque on the free layer 12. When the torque of the spin-polarized current passing through the layer stack 15 is greater than a critical switching current density, the magnetization of the free layer 12 may switch. In this manner, the magnetization of the free layer 12 can be aligned to be either parallel to the magnetization of the pinned layer 16 or antiparallel to the magnetization of the pinned layer 16, and the resistance state across the layer stack is changed.

The sensing element 22 has a meander shape in which the layer stack 15 winds in an alternating back-and-forth pattern. In that regard, the sensing element 22 includes segments 18 of the layer stack 15 in the form of strips that have a parallel or substantially parallel alignment, as well as segments 20 of the layer stack 15 in the form of strips that connect the ends of neighboring or adjacent pairs of the segments 18 to provide the meander shape. The segments 20 are located proximate to the ends of the segments 18, the segments 20 are oriented transverse or substantially transverse to the segments 18, and the segments 20 may be aligned in respective rows. The outermost segments 18 that terminate the sensing element 22 and the segments 20 define an outer boundary 21 of the sensing element 22 at its outer side edges. The outer boundary 21 may have a rectangular geometrical shape and may fully surround the segments 18, 20 of the sensing element 22.

The structure 10 further includes dummy elements 24 that are positioned in rows adjacent to the respective rows of segments 20 and outside of the outer boundary 21 of the sensing element 22. In an embodiment, each dummy element 24 may be positioned adjacent to only one of the segments 20. Adjacent dummy elements 24 in each row are separated by a gap, g. The sensing element 22 is laterally arranged between one row of the dummy elements 24 and another row of the dummy elements 24.

The dummy elements 24 are also formed from portions of the layer stack 15, and have the same thickness and layer arrangement as the segments 18, 20 of the sensing element 22. The dummy elements 24 are detached from the sensing element 22, as well as from each other, such that the dummy elements 24 are not in the current path for sensing purposes but are instead used to tune the performance of the sensing element 22. In that regard, the dummy elements 24 are spaced from the segments 20 of the sensing element 22 by a distance, d. In an embodiment, each dummy element 24 may be spaced from its adjacent segment 20 by a distance, d, of about 0.1 micrometer to about 10 micrometers.

Each dummy element 24 may include one or more semicircular shapes 26 that are merged or combined. In the representative embodiment, each dummy element 24 includes a pair of semicircular shapes 26. Each semicircular shape 26 includes a flat side surface 28 and a curved side surface 30 that is connected with the flat side surface 28. The flat side surface 28 may be planar, and the flat side surfaces 28 of the semicircular shapes 26 in each row may be coplanar. The flat side surface 28 of each semicircular shape 26 may be arranged in a spaced relationship adjacent to one of the segments 20. For each semicircular shape 26, the associated flat side surface 28 is laterally arranged between the curved side surface 30 and the outer boundary 21 of the sensing element 22, and therefore between the curved side surface 30 and the adjacent one of the segments 20.

The semicircular shapes 26 and their respective curved side surfaces 30 partially overlap with each other to provide a composite shape that includes a cusp. In the representative embodiment, the cusp is centrally located between the respective curved side surfaces 30 of the pair of semicircular shapes 26. Each semicircular shape 26 has a length dimension, L1, and the sum of the lengths, L1, of the semicircular shapes 26 may be equal or substantially equal to the length dimension, L2, of the side surface of the segments 20. Each semicircular shape 26 also have a height, h, that is equal to the radius of the curved side surface 30. Each semicircular shape 26 may have an aspect ratio that is defined as a ratio of the height of the curved side surface 30 to the length of the flat side surface 28. In the representative embodiment, the aspect ratio of the semicircular shapes 26 is greater than unity (1).

Dummy elements 27 may be also arranged adjacent to the terminating ends of the outermost segments 18 of the sensing element 22. The dummy elements 27 are also formed from portions of the layer stack 15, and have the same thickness and layer arrangement as the segments 18, 20 of the sensing element 22. The dummy elements 27 are located outside of the outer boundary 21 of the sensing element 22. Each dummy element 27 may include a single semicircular shape or a portion of a single semicircular shape similar to the semicircular shapes 26 that are combined to form the dummy elements 24. The dummy elements 27 are detached from the sensing element 22, and are also detached from the dummy elements 24.

The structure 10 further includes dummy elements 32 that are positioned adjacent to the outermost segments 18 and outside of the outer boundary 21 of the sensing element 22. The dummy elements 32 are also formed from portions of the layer stack 15, and have the same thickness and layer arrangement as the segments 18, 20 of the sensing element 22 and as the dummy elements 27. The dummy elements 32 are also detached from the sensing element 22 as well as detached from the dummy elements 24 and the dummy elements 27. In the representative embodiment, the dummy elements 32 have a rectangular geometrical shape, which differs from the semicircular geometrical shape of the dummy elements 24. The sensing element 22 is arranged between the dummy elements 32 on opposite side edges of the outer boundary 21.

The dummy elements 24, which include at least one curved side surface 30, function to avoid pinning of the magnetic moments of the changing magnetization of the free layer 12 during operation. Changing the aspect ratio of the semicircular shapes 26 of the dummy elements 24 provides the ability to tune the coercive field and sensitivity of the operating sensing element 22. The dummy elements 24, 27, 32, which are detached from the sensing element 22, do not impact the initial resistance of the sensing element 22.

The sensing element 22 and the dummy elements 24, 27, 32 may be formed by sequentially depositing layers of the materials of the layers 12, 14, 16 to define the layer stack 15, and patterning the layer stack 15 to shape the sensing element 22 and the dummy elements 24, 27, 32. The lithography process may entail forming an etch mask that includes a layer of a light-sensitive material, such as an organic photoresist, applied by a spin coating process, pre-baked, exposed to light projected through a photomask, baked after exposure, and developed with a chemical developer to form respective openings over the intended locations for the sensing element 22 and the dummy elements 24, 27, 32. The etching process may be a reactive ion etching process, and the etch mask may be stripped by, for example, plasma ashing, followed by a cleaning process.

Figure 4:
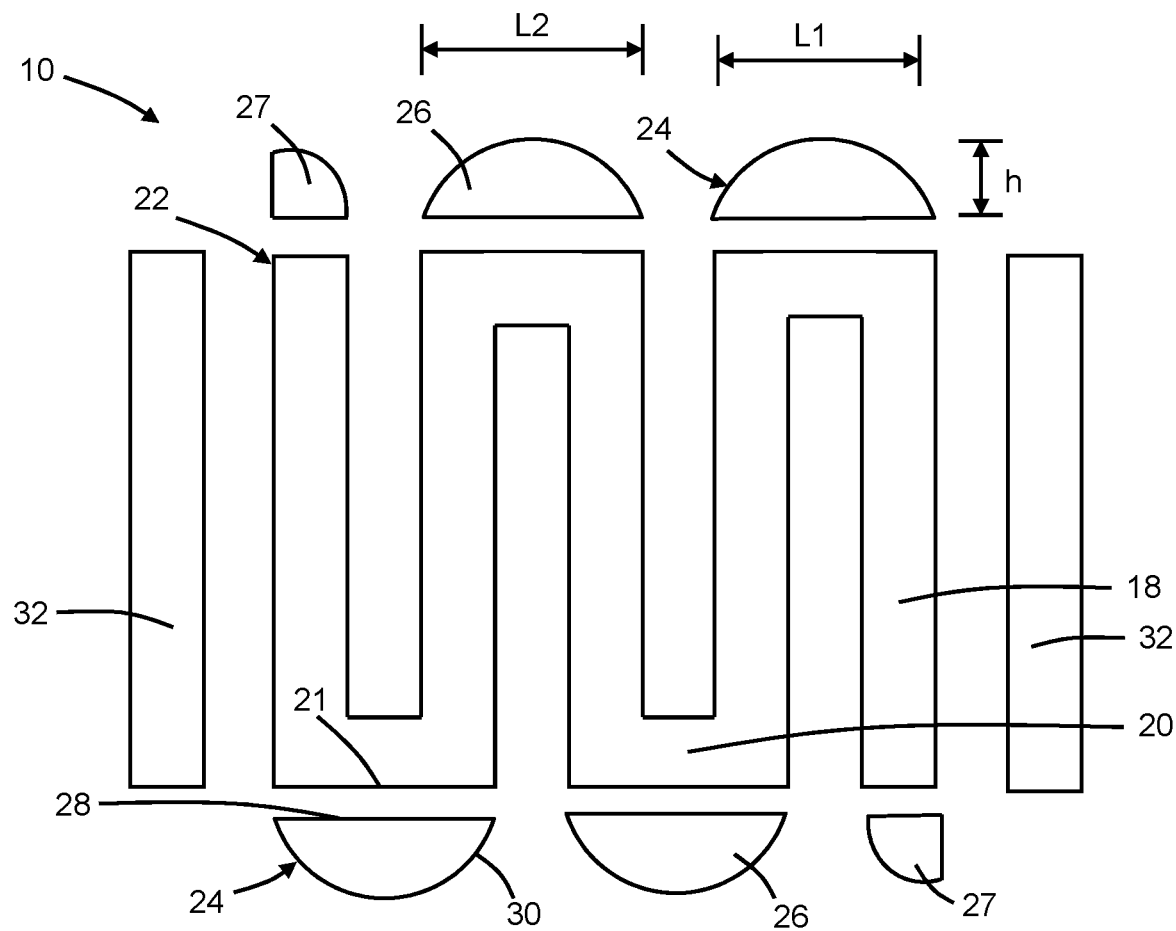
FIGS. 4, 5, and 6 are diagrammatic top views of structures in accordance with alternative embodiments of the invention.

With reference to FIG. 4 in which like reference numeral refer to like features in FIG. 1 and in accordance with alternative embodiments, each dummy element 24 may be modified to include a single semicircular shape 26 having an aspect ratio equal or approximately equal to unity (1). In that regard, the length dimension, L1, of the single semicircular shape 26 may be equal or substantially equal to the length dimension, L2, of the side surface of the segments 20. As a result of the modification, each dummy element 24 only includes one curved side surface 30.

Figure 5:
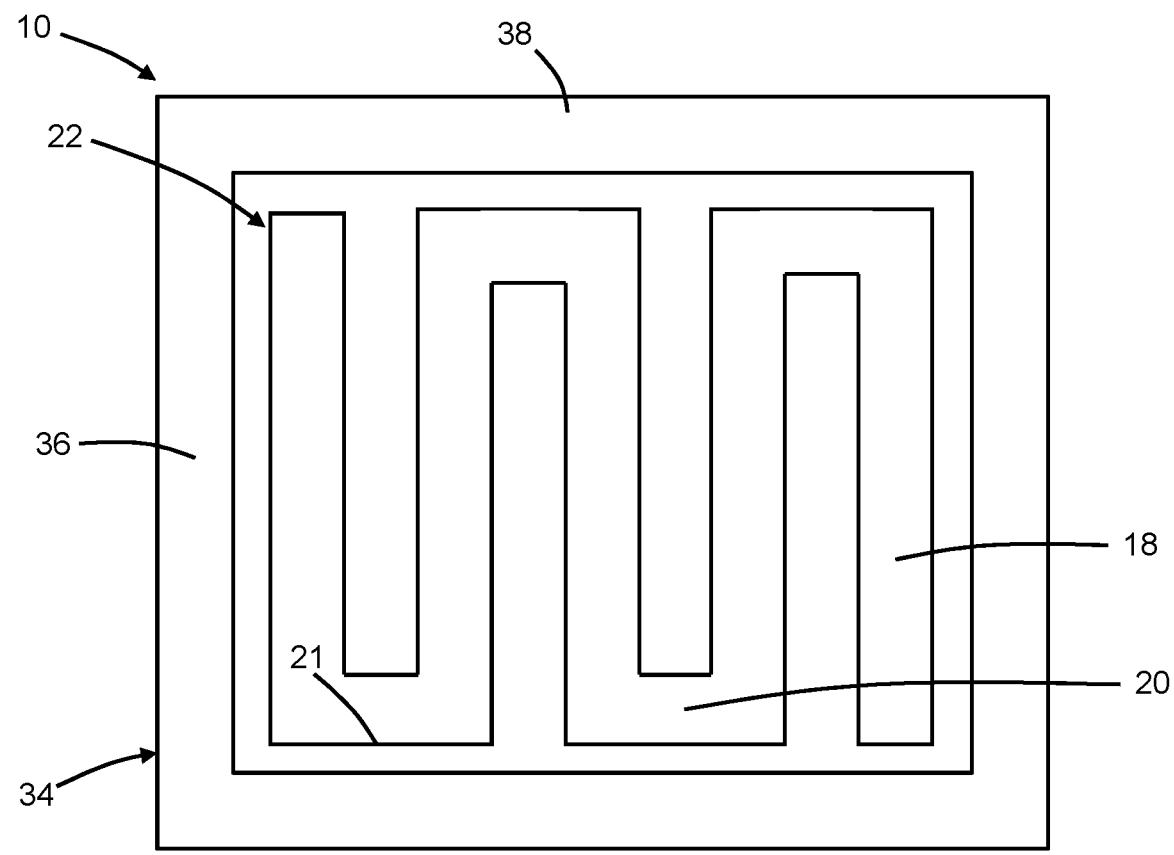

With reference to FIG. 5 in which like reference numeral refer to like features in FIG. 1 and in accordance with alternative embodiments, a dummy element 34 provides an unbroken, rectangular annulus that fully surrounds the sensing element 22 on all sides. The dummy element 34 includes segments 36 that are aligned with the segments 18 of the sensing element 22, and segments 38 that are aligned transverse to the segments 18 of the sensing element 22. The segments 36, 38 are continuous and frame the sensing element 22.

Figure 6:
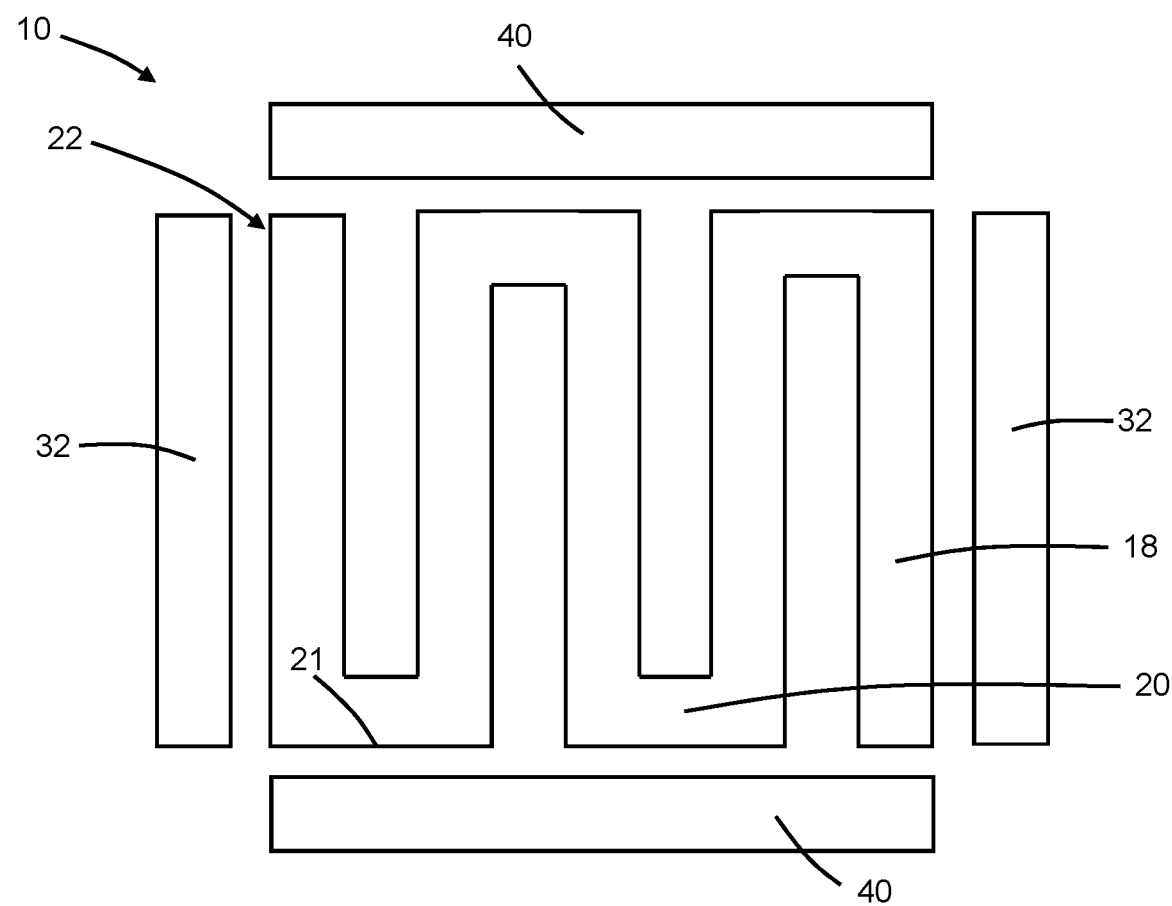

With reference to FIG. 6 in which like reference numeral refer to like features in FIG. 1 and in accordance with alternative embodiments, additional dummy elements 40 similar to dummy elements 32 may be used in combination with the dummy elements 32. The dummy elements 32, 40 are arranged in a pattern about the periphery of the sensing element 22 and on all sides of the sensing element 22 with breaks between adjacent dummy elements 32, 40.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a sensing element including a free magnetic layer, a pinned magnetic layer, and a non-magnetic conductive spacer layer between the free magnetic layer and the pinned magnetic layer, the sensing element having an outer boundary; and
   a first dummy element positioned outside of the outer boundary of the sensing element, the first dummy element detached from the sensing element,
   wherein the first dummy element includes a first semicircular shape with a first curved side surface and a second semicircular shape with a second curved side surface, and the first curved side surface of the first semicircular shape partially overlaps with the second curved side surface of the second semicircular shape.

2. The structure of claim 1 wherein the free magnetic layer, the non-magnetic conductive spacer layer, and the pinned magnetic layer are arranged in a layer stack, the sensing element comprises a first portion of the layer stack, and the first dummy element comprises a second portion of the layer stack.

3. The structure of claim 1 wherein the first semicircular shape includes a first flat side surface and the second semicircular shape includes a second flat side surface, the first flat side surface of the first semicircular shape is arranged between the first curved side surface of the first semicircular shape and the outer boundary, and the second flat side surface of the second semicircular shape is arranged between the second curved side surface of the second semicircular shape and the outer boundary.

4. The structure of claim 3 wherein the first flat side surface of the first semicircular shape is coplanar with the second flat side surface of the second semicircular shape.

5. The structure of claim 4 wherein the sensing element includes a plurality of segments that are arranged inside the outer boundary in a meander shape, and the first flat side surface of the first semicircular shape and the second flat side surface of the second semicircular shape are each positioned outside of the outer boundary in a spaced relationship relative to one of the plurality of segments.

6. A method comprising:
   forming a sensing element including a free magnetic layer, a pinned magnetic layer, and a non-magnetic conductive spacer layer between the free magnetic layer and the pinned magnetic layer; and
   forming a first dummy element positioned outside of an outer boundary of the sensing element,
   wherein the first dummy element is detached from the sensing element, and the sensing element and the first dummy element are concurrently formed.

7. The method of claim 6 wherein the first dummy element fully surrounds the sensing element.

8. A structure comprising:
   a sensing element including a free magnetic layer, a pinned magnetic layer, and a non-magnetic conductive spacer layer between the free magnetic layer and the pinned magnetic layer, the sensing element having an outer boundary;
   a first dummy element positioned outside of the outer boundary of the sensing element, the first dummy element detached from the sensing element; and
   a second dummy element positioned adjacent to the outer boundary of the sensing element, the second dummy element detached from the sensing element, and the second dummy element detached from the first dummy element,
   wherein the second dummy element includes one or more curved side surfaces.

9. The structure of claim 8 wherein the sensing element is laterally positioned between the first dummy element and the second dummy element.

10. The structure of claim 1 wherein the sensing element includes a plurality of segments that are arranged inside the outer boundary in a meander shape, and the first dummy element is positioned outside of the outer boundary in a spaced relationship relative to one of the plurality of segments.

11. The structure of claim 10 wherein the first dummy element has a first length, and the one of the plurality of segments has a second length that is substantially equal to the first length.

12. The method of claim 6 wherein the first dummy element has a rectangular geometrical shape.

13. The method of claim 6 wherein the free magnetic layer, the non-magnetic conductive spacer layer, and the pinned magnetic layer are arranged in a layer stack, the sensing element comprises a first portion of the layer stack, the first dummy element comprises a second portion of the layer stack, and the sensing element and the first dummy element are concurrently formed from the layer stack by lithography and etching processes.

14. The method of claim 6 wherein the sensing element includes a plurality of segments that are arranged inside the outer boundary in a meander shape, and the first dummy element is positioned outside of the outer boundary in a spaced relationship relative to one of the plurality of segments.

15. The method of claim 6 wherein the first dummy element includes a first semicircular shape with a first curved side surface and a second semicircular shape with a second curved side surface, and the first curved side surface of the first semicircular shape partially overlaps with the second curved side surface of the second semicircular shape.

16. The method of claim 6 wherein the first dummy element includes one or more curved side surfaces.

17. The method of claim 6 further comprising:
forming a second dummy element positioned adjacent to the outer boundary of the sensing element,
wherein the second dummy element is detached from the sensing element, and the second dummy element is detached from the first dummy element.

18. The structure of claim 1 further comprising:
a second dummy element positioned adjacent to the outer boundary of the sensing element, the second dummy element detached from the sensing element, and the second dummy element detached from the first dummy element.

19. The structure of claim 18 wherein the second dummy element includes a third semicircular shape with a third curved side surface and a fourth semicircular shape with a fourth curved side surface, and the third curved side surface of the third semicircular shape partially overlaps with the fourth curved side surface of the fourth semicircular shape.

20. The structure of claim 8 wherein the first dummy element includes one or more curved side surfaces.

* * * * *